United States Patent [19]

Wright et al.

[11] Patent Number: 5,831,699
[45] Date of Patent: Nov. 3, 1998

[54] DISPLAY WITH INACTIVE PORTIONS AND ACTIVE PORTIONS, AND HAVING DRIVERS IN THE INACTIVE PORTIONS

[75] Inventors: Phil Wright, Scottsdale; Diana Chen, Gilbert; Fred V. Richard, Scottsdale; Karen E. Jachimowicz, Laveen; Rong-Ting Huang, Gilbert, all of Ariz.

[73] Assignee: Motorola, Inc., Schaumburg, Ill.

[21] Appl. No.: 639,671

[22] Filed: Apr. 29, 1996

[51] Int. Cl.⁶ .............................. G02F 1/13; G02F 1/00; H04N 5/74

[52] U.S. Cl. .................... 349/73; 345/32; 345/55; 345/82; 345/84; 345/204; 349/57; 349/149; 349/5; 348/744; 348/750; 348/758; 359/298

[58] Field of Search ........................ 349/73, 57, 149, 349/5; 345/32, 55, 82, 84, 204; 359/298, 237; 348/744, 750, 758

[56] References Cited

U.S. PATENT DOCUMENTS

| | | | |
|---|---|---|---|
| 3,639,684 | 2/1972 | Levine | 348/269 |
| 4,934,773 | 6/1990 | Becker | 359/214 |
| 5,541,401 | 7/1996 | Nilsson | 250/208.1 |
| 5,715,021 | 2/1998 | Gibeau et al. | 348/750 |
| 5,715,029 | 2/1998 | Fergason | 349/196 |

*Primary Examiner*—William L. Sikes
*Assistant Examiner*—Kenneth Parker
*Attorney, Agent, or Firm*—Eugene A. Parsons

[57] ABSTRACT

An integrated electro-optical package including an array composed of a substrate having defined thereon a plurality of unit cells, composed of active and inactive areas. The substrate having positioned thereon a major surface, a plurality of sub-arrays and driver/control circuits. The sub-arrays, defining the active area formed within each unit cell, and being composed of a plurality of light emitting devices. The driver/control circuits mounted to the substrate within the inactive area of each unit cell. The electro-optical package fabricated to allow for scanning of the active area of each unit cell to create a resultant integrated image of increased resolution, without an increase in the number of pixels formed by the light emitting devices of the sub-arrays.

22 Claims, 6 Drawing Sheets

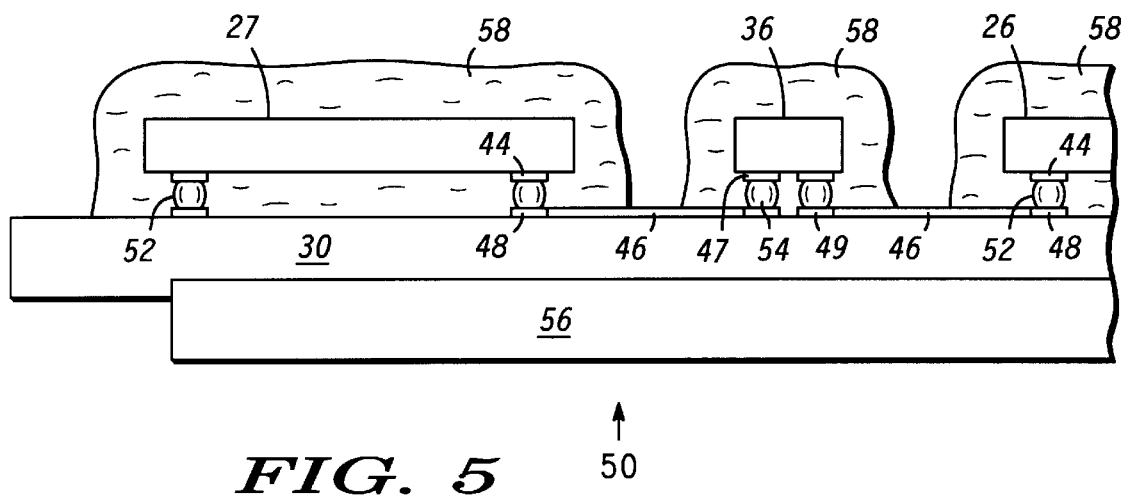
FIG. 5
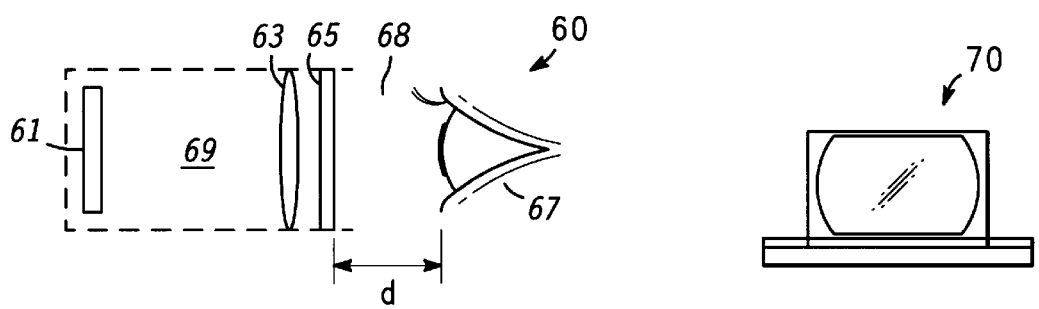
FIG. 6          FIG. 7
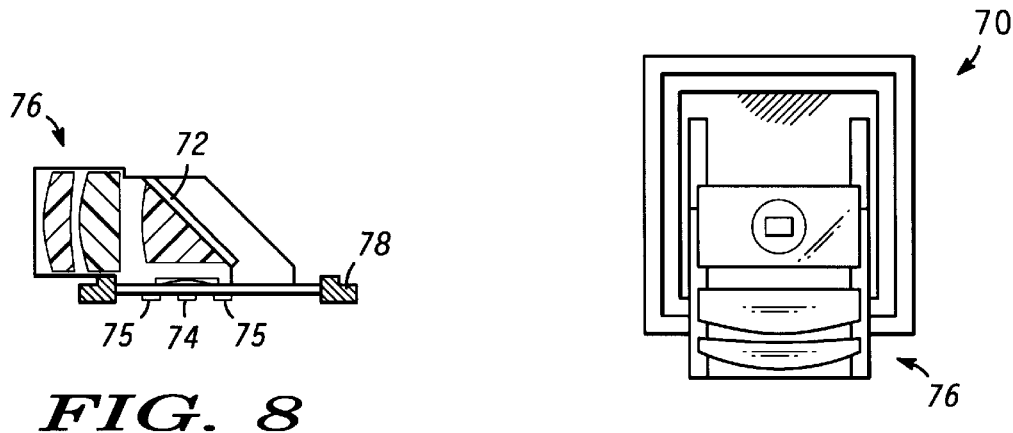
FIG. 8          FIG. 9

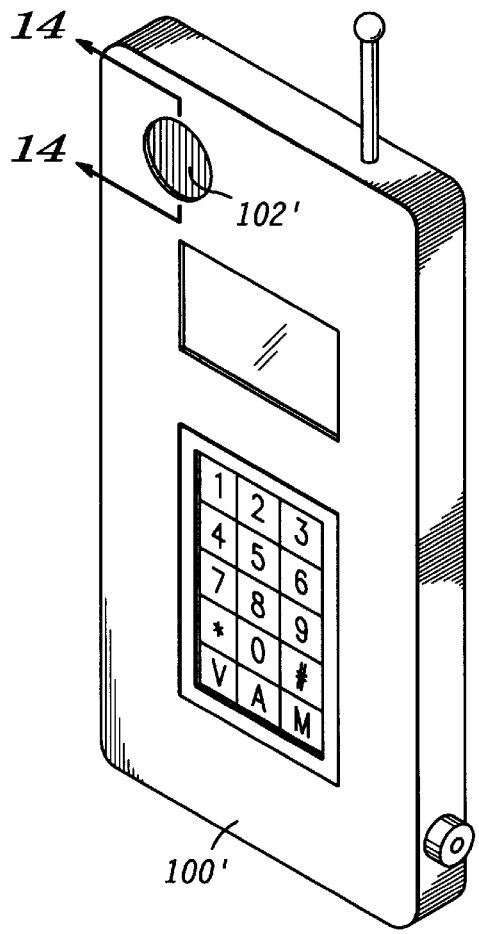
FIG. 13
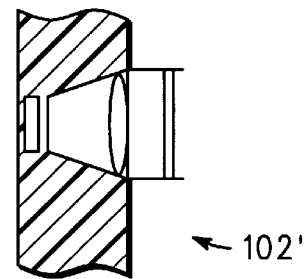
FIG. 14
FIG. 15
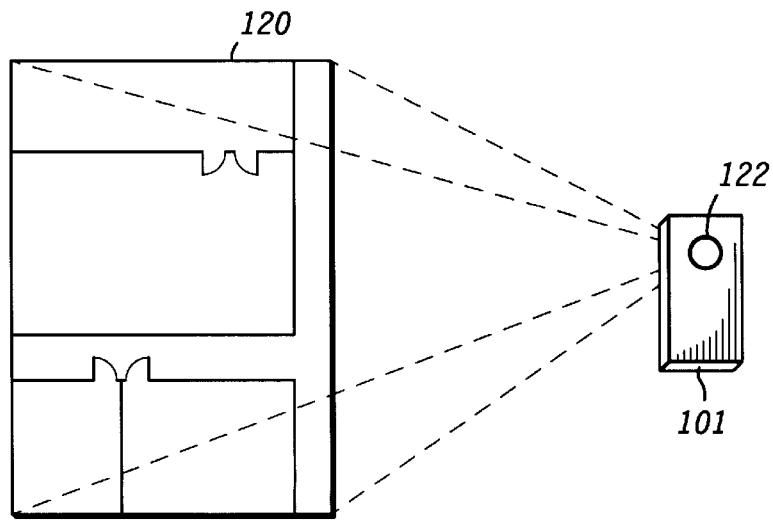

DISPLAY WITH INACTIVE PORTIONS AND ACTIVE PORTIONS, AND HAVING DRIVERS IN THE INACTIVE PORTIONS

FIELD OF THE INVENTION

The present invention pertains to the field of miniature visual displays, and more particularly to electro-optical packages that integrate electrical and optical components and utilize scanning techniques to project a fully integrated image within an observer's field of view.

BACKGROUND OF THE INVENTION

The human visual system is a complex system with a great ability to absorb vast amounts of information originating in many varying formats, including visual displays. Visual displays are found in varying sizes and forms in today's world, displaying many types of information, from large visual display screens announcing scheduling information found in airports, to small visual displays, such as those incorporated into pocket calculators. Of concern in the reduction in the size of visual displays, specifically those utilized in portable electronic devices, such as portable communications equipment, or the like, is the number and complexity of electrical interconnects, the display resolution quality and the maintenance of minimal power requirements and low manufacturing costs.

Of relevance in the reduction in size of visual displays, and the maintenance of resolution quality, is the human visual system's ability to process and integrate information, and the speed at which the visual system is able to do so. The human visual system can process information no faster than 60 Hz. Therefore, an image that is projected and scanned within ⅟₆₀th of a second to varying positions within a visual display is seen by the eyes of the viewer as one enlarged integrated image. As an example, by moving an image of an "A" to six different locations within a visual display, at a speed of 60 Hz, the viewer will see one integrated image composed of six "A"s. If the image is simultaneously content modulated, for example, the images are of six letters "A", "B", "C", "D", "E" and "F" that are individually and sequentially moved to six varying positions at a speed of 60 Hz., the viewer will see one integrated image composed of the six letters. This process, more commonly known as time-multiplexed imagery, can be utilized in the field of display technology through the use of scanners, and more specifically in the development of electro-optical packages for use in enhanced resolution miniature visual displays.

A vast amount of effort has been expended to develop compact, lightweight, low-power visual displays. As display technology reduced the size of visual displays, the resolution of such displays was difficult to maintain. Of greatest importance in the development of these miniature visual displays is the manufacturing costs. It has been shown that as the active area of a display decreases, pixel size of the image source must decrease to maintain resolution. As higher resolution is desired, the number of pixels of the image source and the cost of materials and manufacturing increases, in part because of the number of electrical interconnects required for the increased number of pixels.

Generally, an image source, more specifically an electro-optical package, composed of electrical and optical components, a semiconductor chip, or integrated circuit, is mounted on a printed circuit board or the like and the accepted method for connecting the chip to external driver/control circuits is to use standard wire bond technology. However, when a semiconductor chip having a relatively large array of electrical components or devices formed thereon is to be connected, standard wire bond techniques can become very difficult.

At the present time wire bond interconnects from bond pads having a pitch of 4.8 milli-inches is the best that is feasible. Thus, in a standard array composed of 100×100 light emitting devices the bond pads on the perimeter of the semiconductor chip would have a minimum pitch of 4.8 milli-inches, with 50 bond pads situated along each edge of the perimeter. As more devices are included in the array, more bond pads are required and the perimeter size to accommodate the additional bond pads increases at an even greater rate. That is, since the minimum pitch of the bonding pads is 4.8 milli-inches, the pitch of the devices in the array can be as large as 2.4 milli-inches, or approximately 61 microns, without effecting the size of the chip. Thus, even if the devices can be fabricated smaller than 61 microns, the minimum pitch of the bonding pads will not allow the perimeter of the chip to be made any smaller. It can quickly be seen that the size of the semiconductor chip is severely limited by the limitations of the wire bonding technology.

Scanning devices known today are used to aid in increasing the resolution of visual displays from a minimal number of pixels of an image source. These scanning devices can be found in many forms, most commonly electro-mechanical scanners incorporating mirrors, such as galvanometric scanners and polygonal scanners. These types of electro-mechanical scanners are commonly quite large in size, therefore not amenable to the incorporation into a display device that is small, lightweight, operates on low power consumption and meant to be portable in nature. In addition, mechanical scanners are expensive to manufacture and utilize great amounts of power.

Thus, there is a need for interconnect and packaging structures and techniques which can substantially reduce the limitation on size of packages by mounting a plurality of sub-arrays directly on a substrate, having a plurality of driver/control devices mounted directly on the substrate between the sub-arrays, thus allowing for the sub-arrays to be scanned to generate a resultant image, thereby utilizing fewer pixels and thus fewer interconnects, leading to increased manufacturing yield, thus decreased manufacturing costs.

Accordingly, it is highly desirable to provide for an electro-optical package that is formed by mounting individual sub-arrays, directly to a substrate and mounting a plurality of driver/control devices between the sub-arrays. The electro-optical package, or image source, in operation utilizes an externally positioned phase spatial light modulator scanner to spatially modulate the phase of the light emitted by the package, thereby providing for scanning of the sub-arrays, thus generating a resultant low-powered miniature visual display with resolution enhancement.

It is a purpose of the present invention to provide a new and improved integrated electro-optical package for display resolution enhancement for use in miniature visual displays.

It is a further purpose of the present invention to provide a new and improved electro-optical package for use in visual display systems for display resolution enhancement which utilizes a plurality of sub-arrays mounted to a substrate, having positioned therebetween each sub-array, a plurality of driver/control devices, that in combination with an externally positioned phase spatial light modulator scanner allows for spatial modulation of the light emitted by the electro-optical package, thereby permitting the use of an electro-optical package having fewer number of pixels and interconnects into a visual display system.

It is another purpose of the present invention to provide for an electro-optical package and method of fabrication that utilizes a plurality of sub-arrays and minimal electrical interconnects to generate a resultant integrated image by scanning these sub-arrays, that can be incorporated into a miniature visual display.

SUMMARY OF THE INVENTION

The above problems and others are substantially solved and the above purposes and others are realized in an integrated electro-optical package that utilizes sub-arrays, mounted on a substrate, having positioned therebetween a plurality of driver/control devices. The electro-optical package is of minimal size, thereby permitting incorporation into a visual display system composed of the electro-optical package, or image source, a phase spatial light modulator scanner, such as a liquid crystal phase spatial light modulator scanner, and optical elements.

The electro-optical package is formed by dividing a whole array, comprised of light emitting devices, into smaller sub-arrays. The sub-arrays are then mounted directly on a substrate, thereby defining an image source having an inactive to active area ratio of any number. There are mounted in between the sub-arrays, a plurality of driver/control devices, for driving and controlling the light emitting devices which form the sub-arrays. In operation, the light emitted by the sub-arrays is scanned by utilizing a phase spatial light modulator scanner to fill in the inactive areas located between the sub-arrays, thereby generating a resultant integrated image having high resolution. In that sub-arrays are used as well as scanning techniques which reduces the number of required light emitting devices, the number and complexity of electrical interconnects extending from the light emitting devices to the driver/control devices is minimal, leading to a an increase in manufacturing yield and thus a reduction in manufacturing costs.

In operation, a phase spatial light modulator scanner is utilized, such as a liquid crystal phase spatial light modulator scanner, in which a liquid crystal material is used to spatially modulate the phase, and therefore the direction, of light generated by the sub-arrays of light emitting devices, most commonly light emitting diodes or vertical cavity surface emitting lasers (VCSELs), thereby generating a resultant integrated image and enhancing the resolution of the integrated image being viewed. It should be understood that alternative light or image generating devices can be utilized such as organic light emitting devices (LEDs), cathode ray tubes (CRTs), field emission displays (FEDs), electroluminescent displays, plasma displays, liquid crystal displays (LCDs), etc., but the general term "light emitting devices" will be utilized throughout this disclosure for the sake of simplicity.

In general, the scanner serves to spatially modulate the phase of the generated light waves to produce a directional change of the light passing therethrough. In the instance where a liquid crystal phase spatial light modulator scanner is utilized, this is accomplished based on the principle that the structural organization of the molecules, which compose the liquid crystal material, is not rigid, meaning that the molecules can be easily reoriented as a direct result of an external stimulus. Under appropriate conditions, this exertion of an external stimulus on the liquid crystal material results in the reorientation of the molecular structure of the liquid crystal, thereby causing the light passing therethrough to undergo a phase change. It should be understood that varying amounts of voltage applied to the liquid crystal, will result in varying phase modulations, thus varying the directional travel of the light passing therethrough.

During the operation of the scanner, a voltage is applied to the scanner, thereby causing a resulting change in optical characteristics, such as double refraction/birefringence effects, optical rotation, dichroism or optical scattering. This response to the applied voltage is converted to a visible change in aperture ratio and/or number of pixels of the generated resultant integrated image when viewed by the observer. More specifically, the phase of the light waves generated by the sub-arrays are spatially modulated, producing the resultant integrated image viewable by the observer. The integrated image appears to have high resolution, and higher aperture ratio, yet the number of active pixels on the image source remains the same.

The scanner operates by scanning the light emitted by the sub-arrays formed in the electro-optical package, thereby generating an integrated image through phase modulation that appears, to the viewer, to fill in the inactive areas, seen as physical gaps, between the sub-arrays. The scanning serves to spatially modulate the phase, or direction of travel, of the light, thereby permitting the light emitted by each individual sub-array scanned to be changed in direction to successively produce missing portions of the integrated image. The number of active pixels on the image source remains the same, in that no additional active area, or pixels, etc. are being utilized, yet the resolution and aperture ratio of the generated integrated image is dramatically increased through the scanning process.

In general, by integrating the driver/control devices on the substrate and positioning them between the sub-arrays of light emitting devices, in conjunction with scanning techniques, the number of pixels used to form the resultant integrated image is decreased, therefore decreasing the number of interconnects. By decreasing the number of pixels and interconnects, the package size is decreased, thereby creating a more cost effective product, in that the manufacturing yield is increased, thereby decreasing the cost of manufacturing.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 5 is an enlarged view of the components of FIG. 1, portions thereof broken away, assembled into a complete package generally as seen from line 5—5 of FIG. 1;

FIG. 6 is a simplified schematic view of a miniature visual image display incorporating the electro-optical package of the present invention;

FIGS. 7, 8 and 9 illustrate a front view, side elevational view, and a top plan, respectively, of an image manifestation apparatus utilizing the electro-optical package of the present invention;

FIG. 13 is a view in perspective of another portable communications receiver incorporating the miniature visual image display of FIG. 7;

FIG. 14 is a simplified view generally as seen from the line 14—14 of FIG. 13; and FIG. 15 is a view in perspective illustrating a typical view as seen by the operator of the portable communications receiver of FIG. 11.

DETAILED DESCRIPTION OF THE PREFERRED EMBODIMENT

Figure 1:
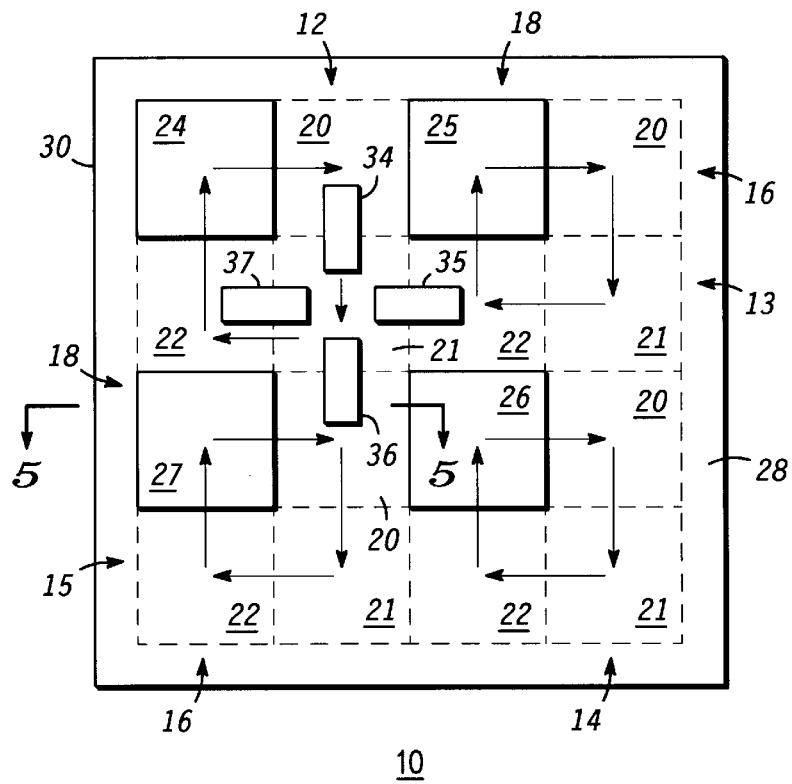
FIG. 1 is a simplified top view of the major surface of an electro-optical package, or light emitting display device, illustrating positioning of the sub-arrays and driver/control devices according to the present invention, and diagramatically illustrating the directional scanning of the sub-arrays.

During the course of this description, like numbers are used to identify like elements according to the different figures that illustrate the invention. The present invention is based on utilizing individually addressable visible light emitting devices formed in a two-dimensional array, that in combination with driver/control circuitry and optical elements compose a light emitting display device, or an integrated electro-optical package, of the present invention. The integrated electro-optical package of the present invention utilizes sub-arrays, positioned to allow for scanning of the light emitted by the sub-arrays to generate a resultant integrated image, by filling in the inactive areas, or gaps, produced by the separation of the sub-arrays. To increase the resolution for a given number of light emitting devices of the electro-optical package or to reduce the number of light emitting devices needed to achieve a desired resolution, sub-array scanning techniques employing a phase spatial light modulator scanner are utilized. The electro-optical package, or light emitting display device, serves as the image source for a visual display system whereby a resulting integrated image is formed by scanning the light emitted by a plurality of sub-arrays through a light modulating material, thereby modulating the phase of the light emitted by the sub-arrays. This phase modulation serves to change the directional travel and in essence "moves" the light to an inactive area of the display chip. This scanning action generates what appears to the observer to be a high resolution resultant integrated image. Those skilled in the art will appreciate that scanning allows a full page display to be created from a much smaller number of display devices than is necessary to generate the full page display, whether for a direct, projected or virtual image. The electro-optical package. or display chip, which serves as the image source in the present invention, is fabricated based on the principle of reducing the number of pixels, thereby decreasing the number of electrical interconnects extending from the light emitting devices to a plurality of driver/control devices, while permitting the generation of a high resolution resultant integrated image.

As previously stated, the purpose of this disclosure is to provide for an electro-optical package, or light emitting display device, in which a plurality of sub-arrays are mounted to a substrate, having positioned therebetween a plurality of driver/control devices. The use of a miniature phase spatial light modulator scanner to bring about the phase modulation of the light emitted by the display chip, positioned externally the electro-optical package, but within the optical train of the light emitted, allows for the electro-optical package to remain small in size and permits it, as well as the liquid crystal scanner components and additional optical elements, to be incorporated into miniature visual displays such as those found in portable electronics equipment, or the like.

Referring now to the accompanying illustrations, disclosed is an electro-optical package, or a two-dimensional light emitting display device fabricated according to the present invention. Specifically, with regard to FIG. 1, illustrated in a simplified top view is a portion of whole array 10 which is illustrated as being divided into four equal quadrants, hereinafter referred to as unit cells 12, 13, 14, and 15. It should be understood that whole array 10 can define any number of replicated unit cells, dependent upon the number of sub-arrays utilized, although array 10 composed of four unit cells will be used through this description for consistency. Each unit cell is composed of an approximate 3:1 ratio of an inactive area 16 to an active area 18. Each of the inactive areas 16 is further defined by a first inactive area 20, a second inactive area 21, and a third inactive area 22. Each of the active areas 18 is further defined by a plurality of sub-arrays 24, 25, 26, and 27.

For simplicity of illustration, only a representative portion of array 10 has been completed. Sub-arrays 24, 25, 26 and 27 are initially fabricated as part of a larger array, thereafter being subdivided and mounted (discussed presently) to a major surface 28 of a substrate 30, such as an optically transparent material, namely optically transparent glass, optically transparent plastic, or the like. In addition, substrate 30 can be formed of silicon, or a thin film ceramic with organic dielectric and thin film metallization. It should be understood that in an alternative embodiment, substrate 30 is opaque and the light emitted by sub-arrays 24, 25, 26, and 27 is emitted in a direction opposite the mounting to substrate 30 (discussed presently). Substrate 30 is defined by a first major surface and a second opposed major surface. Sub-arrays 24, 25, 26, and 27 are each composed of a two-dimensional array of light emitting devices. It should be understood that varying sources of light or image generating devices can be utilized such as inorganic or organic light emitting devices (LEDs), cathode ray tubes (CRTs), field emission displays (FEDs), vertical cavity surface emitting lasers (VCSELs), electroluminescent displays, plasma displays, liquid crystal displays (LCDs), etc. The general term light emitting devices will be utilized throughout this disclosure for the sake of simplicity.

As previously stated, each unit cell 12, 13, 14, and 15 of array 10 is fabricated to define inactive area 16 and active area 18 of array 10. In this specific example the active area 18 of each unit cell 12, 13, 14, and 15, defined by sub-arrays 24, 25, 26, and 27 appears to be approximately 25% of the total area of each unit cell 12, 13, 14, and 15.

There is positioned on major surface 28 of substrate 30, between sub-arrays 24, 25, 26 and 27, a plurality of driver/control circuits 34, 35, 36, and 37. Driver/control circuits 34, 35, 36, and 37 are generally fabricated as smaller integrated circuits which are bump bonded to electrical contacts (discussed presently) on major surface 28 of substrate 30. A plurality of electrical conductors, more commonly known as metal-line interconnects, or traces, (discussed presently) form electrical connections between the light emitting devices of sub-arrays 24, 25, 26, and 27 and driver/control circuits 34, 35, 36, and 37.

During the scanning process of sub-arrays 24, 25, 26, and 27, varying external voltages are applied to a phase spatial light modulator, such as a liquid crystal phase spatial light modulator scanner, hereinafter referred to as "liquid crystal scanner" (discussed presently), which is incorporated into a visual display system, through which the light emitted by array 10 of the electro-optical package passes, resulting in a scanning action of the active area 18 of each unit cell 12, 13, 14, and 15, through the inactive areas 20, 21, and 22 of each unit cell 12, 13, 14, and 15, generally as shown by the directional arrows of FIG. 1. Generally speaking, the active area 18 of each unit cell 12, 13, 14, and 15 is scanned, meaning the light or portion of an image represented by each sub-array 24, 25, 26, and 27 passes through the liquid crystal scanner to which a voltage, or voltages, have been applied, and the resultant light emitted, having undergone a change in phase, changes direction of travel to fill the inactive areas 20, 21 and 22 of each unit cell 12, 13, 14, and 15 of the whole array 10 with a specific portion of the image. The resulting integrated image will appear to have a higher resolution, in that the resulting integrated image will appear to have four times the number of pixels contained in the sub-arrays 24, 25, 26, and 27 due to the scanning effects, although, there is no actual increase in the number of pixels of the image source.

Figure 2:
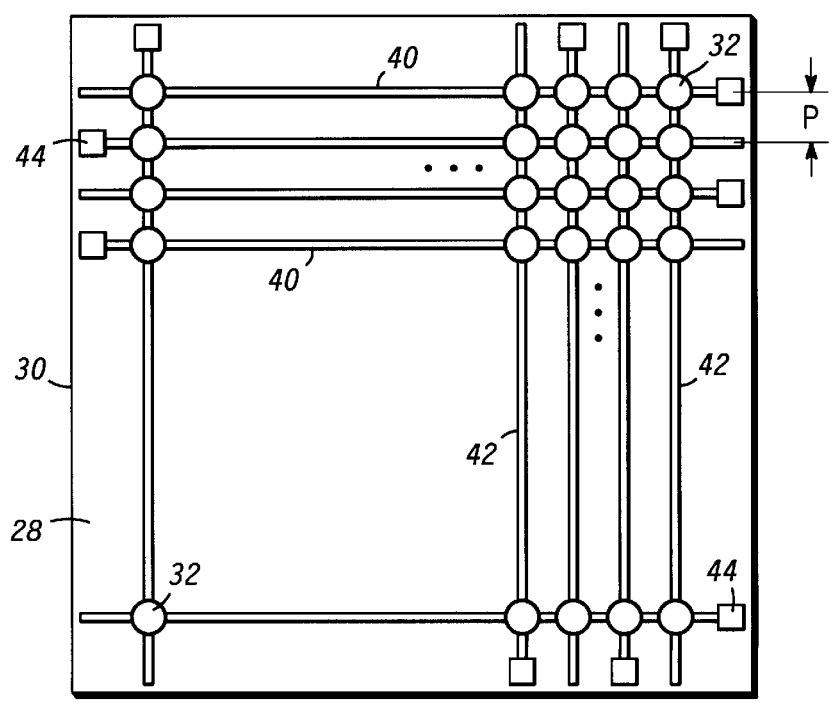
FIG. 2 is a greatly enlarged view in top plan of a partial sub-array of light emitting devices mounted to a substrate.

Referring specifically to FIG. 2, a greatly enlarged view in top plan of a portion of sub-array 24, composed of a plurality of light emitting devices 32, is illustrated. For simplicity of illustration, only a representative portion of sub-array 24 has been completed. It should be understood that the plurality of sub-arrays 24, 25, 26, and 27 of the present invention are similarly formed. As illustrated, each sub-array 24, 25, 26 and 27, defines a plurality of pixels, with light emitting devices 32 positioned in rows and columns and having row/column addressing contacts similar to those used for charged coupled device (CCD) arrays. Contacts to the light emitting devices 32 are formed by conventional deposition and/or etching techniques wherein, for example, common row and column bus contacts are formed to individually address each light emitting device 32, as is generally known in the art. The plurality of driver/control circuits 34, 35, 36, and 37 have data input terminals and further having control signal output terminals (not shown) connected to the light emitting device sub-arrays 24, 25, 26, and 27 through a plurality of connection/mounting pads and electrical conductors, for activating and controlling each of the light emitting devices 32 of the sub-arrays 24, 25, 26, and 27 to generate an image in accordance with data signals applied to the data input terminals.

As illustrated in FIG. 2, each light emitting device 32 defines a pixel, with the plurality of light emitting devices 32 positioned in rows and columns as previously stated. Each light emitting device 32 has first and second electrodes (not shown) to provide an activating potential thereto with the first electrodes of each light emitting device 32 being attached to one of a plurality of horizontal electrical conductors 40 and the second electrode of each light emitting device 32 being attached to one of a plurality of vertical electrical conductors 42. A plurality of external connection/mounting pads 44 are positioned adjacent outer edges thereof. The first electrodes of light emitting devices 32 are connected to a first plurality of external connection/mounting pads 44 by electrical conductors 40, defining rows of pixels, and the second electrodes of light emitting devices 32 are connected to a second plurality of external connection/mounting pads 44 by electrical conductors 42, defining columns of pixels. To completely distribute connection/mounting pads 44 around the periphery of each sub-array 24, 25, 26, and 27, connection/mounting pads 44 are attached to alternate horizontal electrical conductors 40 and alternate vertical electrical conductors 42. Thus, the space available between adjacent connection/mounting pads 44 is 2P, where P represents the spacing between centers of light emitting devices 32.

Figure 3:
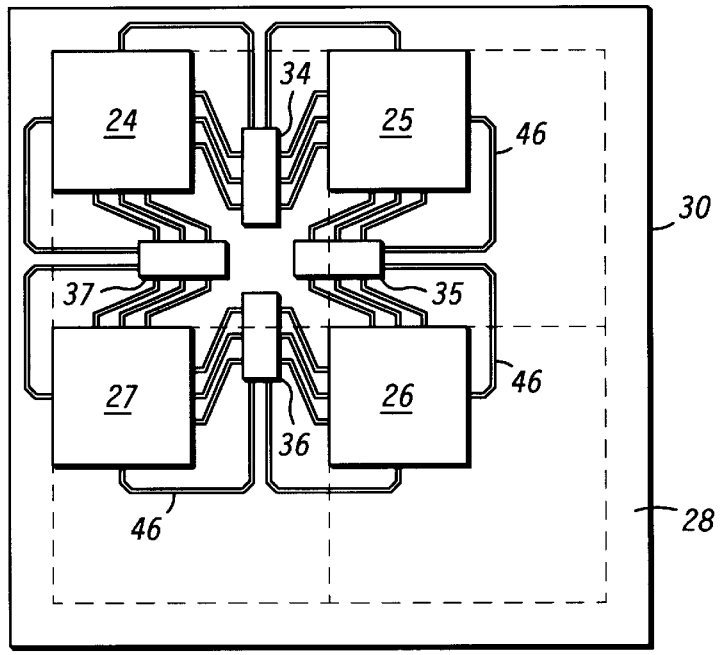
FIG. 3 is a simplified top view of a plurality of sub-arrays of light emitting devices formed on an optically transparent substrate, showing the positioning of the active sub-arrays, the driver/control devices mounted in the inactive areas of the array and electrical conductors extending therebetween.

Referring to FIG. 3, another view array 10, composed of the plurality of sub-arrays 24, 25, 26, and 27 and the plurality of driver/control circuits 34, 35, 36 and 37 is illustrated. In this illustration, a plurality of electrical conductors 46, commonly referred to as metal-line interconnects or traces, are formed on major surface 28 of substrate 30. Electrical conductors 46 are fanned out from a plurality of connection/mounting pads (not shown) that align with connection/mounting pads 44 of the sub-arrays 24, 25, 26, and 27, when sub-arrays 24, 25, 26, and 27 are properly mounted and registered on major surface 28 of substrate 30. Electrical conductors 46 extend from the plurality of connection/mounting pads to a plurality of connection/mounting pads (not shown) that serve as electrical contacts for driver/control circuits 34, 35, 36, and 37 when driver/control circuits 34, 35, 36, and 37 are properly mounted and registered on major surface 28 of substrate 30.

In the instance where substrate 30 is formed of glass, standard thin film metallization can be utilized in which layers of metal are deposited by, for example, sputtering. In a typical metallization system, a first layer of chromium is applied by sputtering to operate as an adhesive layer on the glass. A second layer of copper is applied over the chromium to provide the desired electrical conduction and a layer of gold is applied over the copper to provide a barrier and adhesive layer for the bumps or further connections. It should be understood that the metallizations can be either an additive or subtractive method with the patterning and etching being performed by any of the various methods well known in the art to provide the desired final structure.

Further, in the instance where substrate 30 is formed of glass, the glass is selected to have approximately the same thermal coefficient of expansion as the substrate onto which the light emitting devices 32 are formed, so that when the sub-arrays 24, 25, 26, and 27 of light emitting devices 32 are fixedly bonded to substrate 30 changes in ambient temperature produce substantially the same amount of expansion or contraction and the sub-arrays 24, 25, 26, and 27 are not damaged. It will of course be understood that minor differences in the thermal coefficients which produce minor differences in expansion/contraction can be tolerated if the amount of change between sub-arrays 24, 25, 26, and 27 and substrate 30 is not large enough over the operating temperature range of the structure to damage sub-arrays 24, 25, 26, and 27.

Figure 4:
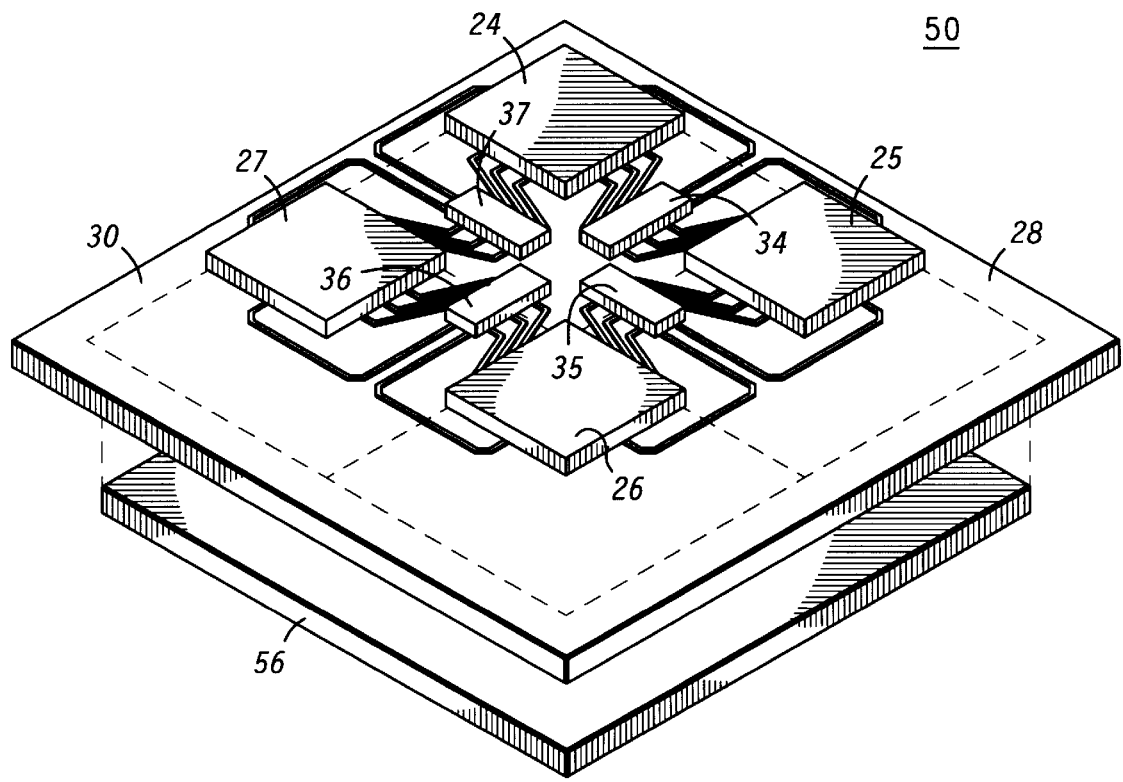
FIG. 4 is an exploded view in perspective illustrating the relative positions of the components of FIGS. 1–3.

An exploded view in perspective illustrating the relative positions of the components of FIGS. 1–3 and additional components included in an electro-optical package 50, are illustrated in FIG. 4. An enlarged view, portions thereof broken away, of the components of FIG. 4 assembled into a complete electro-optical package 50 is illustrated in FIG. 5. In the assembly process, each sub-array 24, 25, 26, and 27 is inverted and mounted on major surface 28 of substrate 30 so that a light emitting surface of each sub-array is down, thereby causing the light emitted by the plurality of light emitting devices 32 to pass through substrate 30. In the instance where substrate 30 is opaque, sub-arrays 24, 25, 26, and 27 are mounted so that the light emitting surface of each sub-array 24, 25, 26, and 27 is up, thereby causing the light emitted by the plurality of light emitting devices 32 to emit in et direction opposite the substrate 30. The plurality of connection/mounting pads 44 of each sub-array 24, 25, 26, and 27 are positioned to each contact a separate connection/mounting pads 48 on substrate 30 when each sub-array 24, 25, 26, and 27 is properly registered on major surface 28 of substrate 30. Each sub-array 24, 25, 26, and 27 has bumps 52 of contacting material deposited on connection/mounting pads 48 for electrically and physically connecting sub-arrays 24, 25, 26, and 27 to substrate 30. Bumps 52 are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. Some compatible metal may improve the assembly procedures, e.g., gold metallization or gold plating on connection/mounting pads 48 of optically transparent substrate 30.

Driver/control circuits 34, 35, 36, and 37 are positioned to allow a plurality of connection/mounting pads 47 of driver/control circuits 34, 35, 36, and 37 to contact a plurality of connection/mounting pads 49 positioned on substrate 30 utilizing bumps 54 of contacting material, similar to bumps 52. Sub-arrays 24, 25, 26, and 27 are electrically interfaced to driver/control circuits 34, 35, 36, and 37 through connection/mounting pads 44, 48, 47 and 49, bump 52 and 54 of contacting material and the plurality of electrical conductors 46 extending therebetween.

In an alternative fabrication technique, sub-arrays 24, 25, 26, and 27 are thermo compression bonded to substrate 30. At the point illustrated in FIG. 4 where sub-arrays 24, 25, 26, and 27 and driver/control circuits 34, 35, 36, and 37 are bonded to substrate 30, sub-arrays 24, 25, 26, and 27 can be easily tested and/or burned in prior to additional assembly of the package. This ability to provide an intermediate test point can be a substantial cost and time saving in the packaging procedure.

In the present invention, fewer electrical conductors, or interconnects, are needed in that there are a fewer number of pixels required to be defined by the sub-arrays 24, 25, 26, and 27, because of the utilization of scanning. Because of this decreased number of interconnects, the manufacturing yield of electro-optical package 50 is increased, thereby reducing manufacturing cost. Further detailed description of image sources composed of a two-dimensional array of light emitting devices similar to sub-arrays 24, 25, 26, and 27 of the present invention, can be found in U.S. Pat. No. 5,432, 358, entitled "Integrated Electro-Optical Package", issued Jul. 11, 1995, assigned to the same assignee and incorporated herein by this reference.

The final additional component in electro-optical package 50 is a lens 56 which is fabricated to overlie substrate 30 on a surface opposite the mounting of sub-arrays 24, 25, 26, and 27 and driver/control circuits 34, 35, 36, and 37. Lens 56 is designed as one of a plurality of refractive and diffractive lenses, or optical elements, to magnify and/or correct the image generated by the sub-arrays 24, 25, 26, and 27 of light emitting devices 32. In the illustrated embodiment, lens 56 is affixed to the underside of substrate 30 by some convenient means, such as optically transparent epoxy or the like, and is fabricated so as to simply overlie the portion of substrate 30, which in this instance if optically transparent, through which the light is emitted. Alternatively, in the instance where substrate 30 is opaque and sub-arrays 24, 25, 26, and 27 are mounted to emit light in a direction opposite substrate 30, lens 56 would be positioned on a side of substrate 30 to allow the emitted light to pass therethrough.

It should be understood that sub-arrays 24, 25, 26, and 27 and driver/control circuits 34, 35, 36, and 37 in the illustrated embodiment, are generally protected by glob top formations 58. For best results sub-arrays 24, 25, 26, and 27, substrate 30 and lens 56 should be constructed with indices of refraction which are as close together as practical. If, for example, the index of refraction of substrate 30 and the lens 56 differs substantially there is a tendency for light to reflect at the interface back into sub-arrays 24, 25, 26, and 27 and the efficiency of electro-optical package 50 is reduced.

As previously stated, the light emitted by sub-arrays 24, 25, 26, and 27 is scanned, thereby "moving" the image to the inactive area 16 of each unit cell 12, 13, 14, and 15, namely through first inactive area 20, second inactive area 21, and third inactive area 22. The scanning device of the present invention utilizes a phase spatial light modulator scanner, more specifically a liquid crystal scanner, as previously disclosed. Further detailed description of the utilization of a visual display system including a liquid crystal scanner can be found in U.S. Patent Application entitled "VISUAL DISPLAY SYSTEM FOR DISPLAY RESOLUTION ENHANCEMENT", filed of equal date herewith, assigned to the same assignee and incorporated herein by this reference. As previously stated, a visual display system is disclosed incorporating an electro-optical package 50 of the present invention, and a scanner that utilizes liquid crystal material to serve as a light modulating medium, thereby spatially modulating the phase of the light passing therethrough. It should be understood that throughout this disclosure when referring to a liquid crystal scanner, that various liquid crystal and ferroelectric liquid crystal materials can be provided which will operate in different modes in response to different signals or potentials applied thereto. In addition, it should be understood that various other phase spatial light modulator scanners could be utilized, such as an electro-optic scanners an and acousto-optic scanners.

The mode of operation of the liquid crystal scanner and the scanning technique to be utilized is dependent upon the fabrication of the array of light emitting devices of the image source and the configuration of an optical system (discussed presently) that are both incorporated into the visual display system of the present invention. The liquid crystal scanner of the present invention operates in either a reflective or a transmissive mode.

At least one polarization member or element is incorporated into the visual display system of the present invention. The polarization member is positioned to allow light emitted by the image source of like polarization, to pass through the polarization member prior to undergoing a change in phase. If, for example, the polarization member is polarized horizontally all light similarly polarized will pass therethrough and light that is of different polarization will be blocked. If the polarization member is vertically polarized, similar results will occur.

Thus, a new and improved electro-optical package composed of a plurality of sub-arrays and driver/control circuits mounted to a substrate, and having as a component thereof, at least one optical element, is provided. The electro-optical package of the present invention is meant to be incorporated into a visual display system, more specifically an electro-optical system, additionally composed of a phase spatial light modulator scanner, driver/control circuitry and optical elements (discussed presently). The visual display system includes various additional optical components while conveniently integrating electrical connections to the components and providing external connections thereto. Light sources, polarizers, diffusers and, if desired, additional optics are conveniently integrated into the system which is easily integrated into portable electronic equipment. It is further disclosed that additional optical elements, such as polarizer plates or layers, refractive elements, diffractive elements, etc. may be easily positioned exterior the visual display system.

It should be understood that the resultant integrated image generated by the visual display system, composed of the electro-optical package, or light emitting display device, the phase spatial light modulator scanner, driver/control circuits and various optical elements, is too small to properly perceive (fully understand) with the human eye and generally requires a magnification of at least 10× for comfortable and complete viewing. Lens 56 can be a single lens with additional optical magnification supplied by an external system or lens 56 can include a complete magnification system. Further, lens 56 can be fabricated from glass, plastic or any other material or method well known to those skilled in the art. Additionally, in an alternative embodiment lens 56, may be molded integral with substrate 30. In some applications, lens 56 may be a complete external magnification system and may not be physically attached as a portion of electro-optical package 50. Accordingly, a visual display system of the present invention is typically formed within a housing, defining an optical magnifier, having integrally formed therein an optical magnification system. The optical magnifier is generally defined by a plurality of sides which compose the housing. Several examples of optical magnifiers with optical magnification systems which may have incorporated therein the electro-optical package 50 of the present invention are illustrated in FIGS. 6 through 10, explained below.

Referring to FIG. 6, a miniature visual image display 60 is illustrated in a simplified schematic view. Miniature visual image display 60 includes image generation apparatus 61, similar to electro-optical package 50 described above, for providing an image. An optical system, represented by lens system 63, is positioned in spaced relation to image generation apparatus 61 of miniature visual image display 60. A transmissive phase spatial light modulator scanner 65 is positioned to allow the light emitted by image generation apparatus 61 to pass therethrough and produces an image viewable by an eye 67 spaced from an aperture 68.

In operation, the light generated by image generation apparatus 61 passes through lens system 63 and scanner 65. Varying external voltages are applied to scanner 65, thereby resulting in a scanning effect of the light emitted by a plurality of sub-arrays, generally similar to sub-arrays 24, 25, 26, and 27 described above, of image generation apparatus 61. The resultant integrated image viewable by the eye 67 of the observer through aperture 68 appears to have a greater number of pixels and an increased aperture ratio, even though the number of pixels of the image generation apparatus 61 remains the same.

Lens system 63, represented schematically by an optical element mounted in spaced relation from image generation apparatus 61, receives the image from image generation apparatus 61 and magnifies it an additional predetermined amount. It will of course be understood that the lens system may be adjustable for focus and additional magnification, if desired, or may be fixed in a separate housing for simplicity. It should be noted that additional optical elements can be provided exterior the miniature visual image display 60 for further image magnification and/or correction.

Eye relief is the distance that eye 67 can be positioned from viewing aperture 68 and still properly view the image, which distance is denoted by "d" in FIG. 6. Because of the size of lens system 63, eye relief, or the distance d, is sufficient to provide comfortable viewing and in the present embodiment is great enough to allow a viewer to wear normal eyeglasses, if desired.

There is provided a light polarizing member integrally formed with liquid crystal scanner 65 positioned so that all light entering or exiting an optical magnifier 69 defined by miniature visual image display 60 passes through and is polarized. It will of course be understood that the polarizing member can be deposited on the surface of a mounting substrate to which image generation apparatus 61 is mounted, in an alternative embodiment, or positioned external scanner 65 within the optical train formed by miniature visual image display 60.

Referring now to FIGS. 7, 8 and 9, another miniature visual image display 70, in accordance with the present invention, is illustrated in a front view, side elevational view, and top plan, respectively. FIGS. 7, 8 and 9 illustrate miniature visual image display 70 approximately the actual size to provide an indication as to the extent of the reduction in size achieved by the present invention. Miniature visual image display 70 includes a reflective phase spatial light modulator scanner 72, an image generation apparatus 74, (generally similar to the electro-optical package 50, described above), a plurality of driver/control circuits 75, and a plurality of optical elements, which comprise an optical magnification system 76. Image generation apparatus 74 is mounted in electrical interface with a standard printed circuit board 78. Reflective phase spatial light modulator scanner 72 is mounted to optical magnification system 76, thereby allowing the light emitted by image generation apparatus 74 to pass through liquid crystal scanner 72 and be reflected back through scanner 72 when exiting the folded optical magnifier formed by optical magnification system 76.

Figure 10:
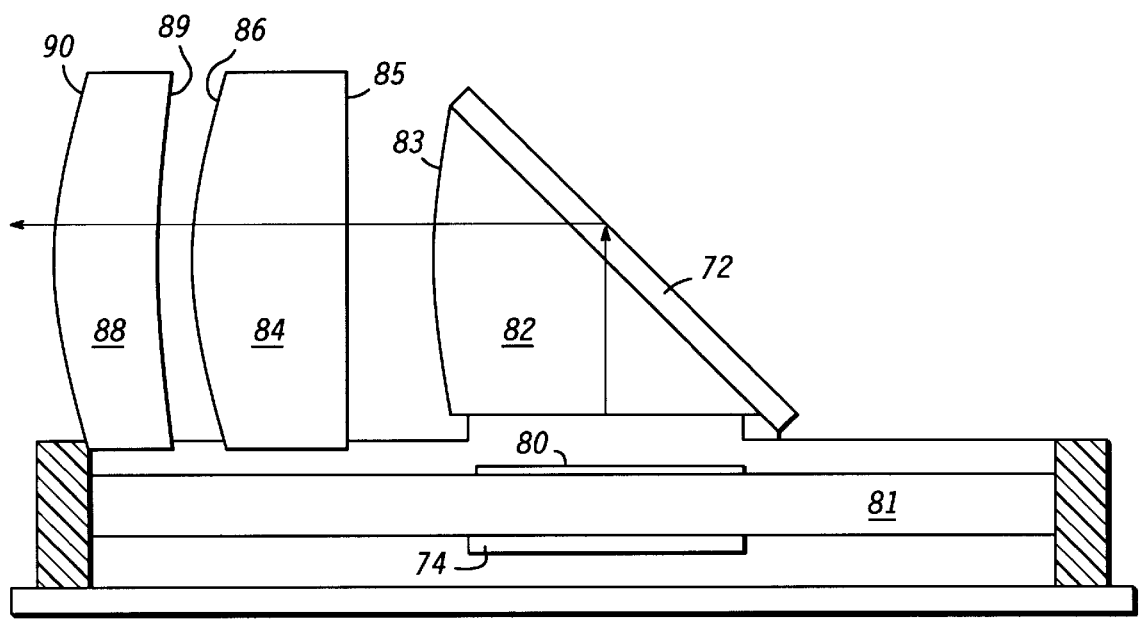
FIG. 10 is a 4x magnified view in side elevation of the apparatus of FIG. 7 utilizing the electro-optical package of the present invention.

Referring specifically to FIG. 10, a 4× magnified view in side elevation of miniature visual image display 70 of FIG. 7 is illustrated for clarity. From this view it can be seen that a polarizing member 80 is affixed directly to the upper surface of a mounting substrate 81 to which image generation apparatus 74 is mounted. A reflective scanner 72 is mounted on an optical prism 82 so that the image generated by scanner 72 passes through a refractive surface 83. The image is then directed to an optical lens 84 having a refractive inlet surface 85 and a refractive outlet surface 86. From optical lens 84 the image is directed to an optical lens 88 having an inlet refractive surface 89 and an outlet refractive surface 90. Also, in this embodiment at least one diffractive optical element is provided on one of the surfaces, e.g. refractive inlet surface 85, to correct for chromatic and other aberrations. The operator looks into outlet refractive surface 90 of optical lens 88 and sees a large, easily discernible visual image which appears to be behind miniature visual image display 70.

It is anticipated by this disclosure that the plurality of optical elements disclosed in FIGS. 6–10, include reflective elements, refractive elements, diffractive elements, polarizers, diffusers, or holographic lenses that may be mounted in overlying relationship to the image generation apparatus, specifically positioned on an interior aspect of the optical magnifiers. It is further disclosed that a plurality of optical elements, including reflective elements, refractive elements, diffractive elements or diffusers may be mounted in overlying relationship to the surface of the optical magnifier through which the light, or resultant integrated image, is output, specifically positioned on an exterior aspect of a light output surface, to form an image plane for the light which forms the resultant integrated image.

The electro-optical package 50 of the present invention is meant to be incorporated into any number of varying visual image display systems, some of which were previously described. These types of visual image display systems are ultimately intended for use in various types of electronic equipment, namely portable communications equipment, cellular and portable telephones, smart-card reader devices, or the like. It should be understood that while the specific electronic devices described below include miniature virtual images, that electro-optical package 50 of the present invention is intended for use in visual image display systems as part of the means for generating a direct, virtual and/or projected image.

Figure 11:
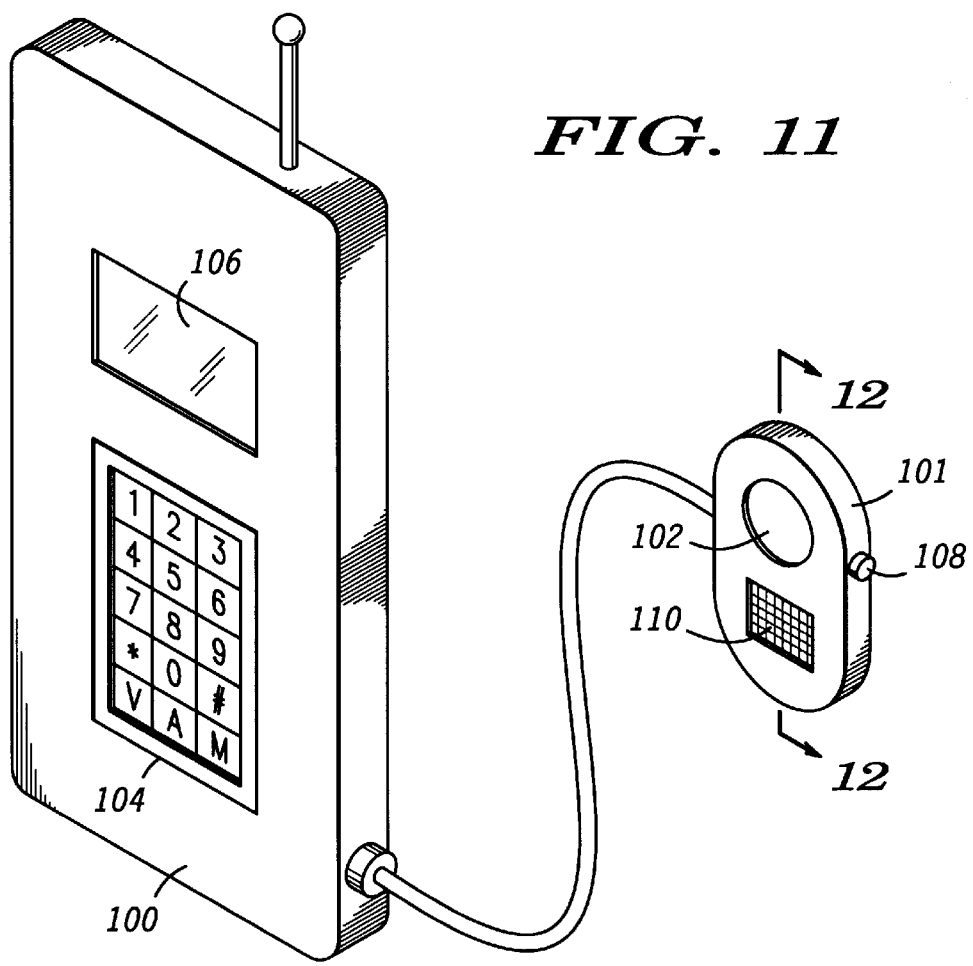
FIG. 11 is a view in perspective of a portable communications receiver incorporating the miniature visual image display of FIG. 7.

Referring now to FIG. 11, illustrated is an example of a portable electronic device, namely a portable communications receiver 100 having a hand held microphone 101 with a miniature virtual image display 102, generally similar to miniature visual image display of FIG. 7, mounted therein. It will of course be understood that portable communications receiver 100 can be any of the well known portable receivers, such as a cellular or cordless telephone, a two-way radio, a pager, a data bank, etc. In the present embodiment, for purposes of explanation only, portable communications receiver 100 is a portable two-way police radio, generally the type carried by police officers on duty or security guards. Portable communications receiver 100 includes a control panel 104 for initiating calls and a standard visual display 106, if desired, for indicating the number called or the number calling. Hand held microphone 101 has a push-to-talk switch 108, a voice pick-up 110 and a miniature virtual image display 102.

Figure 12:
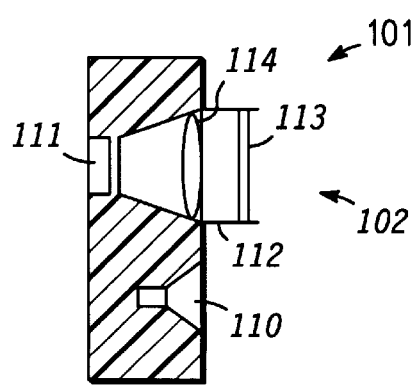
FIG. 12 is a simplified view generally as seen from the line 12—12 of FIG. 11.

Referring to FIG. 12, a simplified sectional view of hand held microphone 101, as seen from the line 12—12 of FIG. 11, is illustrated. Miniature virtual image display 102 includes an image generation apparatus 111, generally similar to electro-optical package 50, described above, for providing an image. The image generated passes through an optical system 112 to a phase spatial light modulator scanner 113, which in turn produces a virtual image viewable by the operator through an aperture 114. Fixed optical system 112 is constructed to magnify the entire image from image generation apparatus 111, without utilizing moving parts, so that the virtual image viewable through aperture 114 is a complete frame, or picture, which appears to be very large (generally the size of a printed page) and is easily discernible by the operator. The entire miniature virtual image display 102 is relatively small and adds virtually no additional space requirements to hand held microphone 101. Optical system 112 is constructed with no moving parts, other than optional features such as focusing, zoom lenses, etc. Further, image generation apparatus 111, in conjunction with scanner 113, requires very little electrical power to generate the image and, therefore, adds very little to the power requirements of portable communications receiver 100.

Referring specifically to FIGS. 13 and 14, a second embodiment is illustrated wherein parts similar to those described in relation to FIGS. 11 and 12 are designated with similar numbers with a prime added to the numbers to indicate a different embodiment. In this embodiment a portable communications receiver 100' has a miniature virtual image display 102' included in the body thereof, instead of in a hand held microphone. A hand held microphone is optional and this specific embodiment is desirable for instances where a hand held microphone is not utilized or not available or for use in pagers and the like which do not transmit. Miniature virtual image display 102' is basically similar to miniature virtual image display 102 of FIGS. 11 and 12 and adds very little to the size, weight, or power consumption of portable communications receiver 100'.

FIG. 15 is a perspective view of hand held microphone 101 illustrating a typical view 120 seen by an operator looking into viewing aperture 122 of miniature virtual image display 102, described in conjunction with FIGS. 11 and 12. View 120 could be, for example, a floor plan of a building about to be entered by the operator (a policeman). In operation, the floor plan is on file at the police station and, when assistance is requested by the policeman, the station simply transmits video representative of the previously recorded plan. Similarly, miniature virtual image display 102 might be utilized to transmit pictures of missing persons or wanted criminals, maps, extremely long messages, etc. Many other variations, such as silent receiver operation wherein the message appears on miniature virtual image display 102 instead of audibly, are possible.

It should be noted that in the prior art, pagers and other small receivers in which visual displays are desired, are especially handicapped by the size of the displays. Generally such displays are limited to a single short line of text or several digits, and the size of the display still dictates the size of the receiver. Further, the display is clearer and easier to read and, because it utilizes a virtual display, requires very little power for the operation thereof. In fact, the present display utilizing the electro-optical package of the present invention uses much less power than any of the direct view displays normally utilized in electronic equipment and, as a result, can be fabricated in much smaller sizes.

Thus, a new and improved electro-optical package composed of a plurality of sub-arrays and driver devices mounted to a substrate, and having mounted thereon at least one optical element is disclosed. The electro-optical package is meant for use in a visual display system incorporating a phase spatial light modulator scanner, which serves to spatially modulate the phase of light emitted by the sub-arrays and generate a resultant integrated image viewable as a direct, virtual or projected image. The package disclosed is relatively easy and inexpensive to manufacture. Light sources, polarizers, diffusers and, if desired, additional optics are conveniently integrated into the small visual display system which is easily integrated into a housing, forming an optical magnifier, for use in portable electronic equipment. By using sub-arrays of light emitting devices for the light source, with low aperture ratios, which are scanned by the phase spatial light modulator scanner to generate a resultant integrated image, characterized by high resolution, the size of the system is further reduced and the electrical power required is also minimized.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated electro-optical package comprising:
   at least one sub-array of light emitting devices cooperating to generate an image, mounted on a substrate, thereby defining an active area and at least one inactive area of a unit cell, the light emitting devices of each sub-array being positioned in rows and columns to define a plurality of pixels of the image and operably connected to a plurality of connection/mounting pads adjacent outer edges of each sub-array;

at least one driver/control circuit having a plurality of connection/mounting pads, mounted to the at least one inactive area defined on the substrate, connected to the light emitting devices through a plurality of electrical conductors extending between the plurality of connection/mounting pads of the at least one driver/control circuit to the plurality of connection/mounting pads of the at least one sub-array; and a lens system mounted to the substrate over the active and inactive areas and on a side of the substrate so as to receive and magnify light emitted by the light emitting devices.

2. An integrated electro-optical package as claimed in claim 1 wherein the substrate is formed of an optically transparent material.

3. An integrated electro-optical package as claimed in claim 2 wherein the optically transparent material includes at least one of optically transparent glass and optically transparent plastic.

4. An integrated electro-optical package as claimed in claim 3 wherein the light emitting devices include devices selected from the group including organic light emitting diodes, inorganic light emitting diodes, vertical cavity surface emitting lasers, field emission devices, and liquid crystal displays.

5. An integrated electro-optical package comprising:

at least one sub-array of light emitting devices cooperating to generate an image composed of a plurality of pixels, each of the light emitting devices having first and second electrodes for activating the light emitting devices, the light emitting devices being positioned in rows and columns to define a plurality of pixels of the image and operably connected to a plurality of external connection/mounting pads adjacent outer edges of the at least one sub-array, with the first electrodes of the light emitting devices being connected to a first plurality of the external connection/mounting pads and the second electrodes of the light emitting devices being connected to a second plurality of the external connection/mounting pads;

at least one driver/control circuit having a data input terminal and further having a control signal output terminal connected to the first and second electrodes of the light emitting devices for activating the light emitting devices to generate an image in accordance with a plurality of data signals applied to the data input terminal; and a substrate, defining a major surface and having mounted thereon a portion of the manor surface, the at least one sub-array, thereby defining at least one active area and at least one inactive area, the at least one driver/control circuit being mounted to the at least one inactive area defined on the substrate, the substrate further having a plurality of electrical conductors formed therein, each extending and fanning out from a first plurality of mounting pads formed on the substrate, electrically interfaced with the at least one driver/control circuit, to a second plurality of mounting pads formed on the substrate, electrically interfaced with the first and second pluralities of external connection/mounting pads of the at least one sub-array.

6. An integrated electro-optical package as claimed in claim 5 including in addition an optical magnification system positioned to allow the light emitted by the light emitting devices to pass therethrough for magnifying the image generated by the at least one sub-array.

7. An integrated electro-optical package as claimed in claim 6 wherein the optical magnification system is integrally formed in the substrate.

8. An integrated electro-optical package as claimed in claim 6 wherein the optical magnification system is comprised of at least one separately fabricated optical element.

9. An integrated electro-optical package as claimed in claim 6 wherein the at least one driver/control circuit is mounted to the inactive area of the substrate having the control signal output terminal electrically contacting the first plurality of mounting pads of the substrate, the first and second pluralities of connection/mounting pads of the at least one sub-array each electrically contacting the second plurality of mounting pads of the substrate.

10. An integrated electro-optical package as claimed in claim 9 wherein the first plurality of mounting pads formed on the substrate include mounting bumps.

11. An integrated electro-optical package as claimed in claim 10 wherein the mounting bumps are formed from material selected from the group including solder, gold, and conducting epoxy.

12. An integrated electro-optical package as claimed in claim 9 wherein the second plurality of mounting pads formed on the substrate include mounting bumps.

13. An integrated electro-optical package as claimed in claim 12 wherein the mounting bumps are formed from a material selected from the group including solder, gold and conducting epoxy.

14. An integrated electro-optical package as claimed in claim 9 wherein the substrate is formed of a material selected from the group including glass, silicon, thin film ceramic and ceramic with organic dielectric and thin film metallization.

15. A visual image display system comprising:

at least one sub-array of light emitting devices cooperating to generate an image, mounted on a substrate, thereby defining an active area and at least one inactive area of a unit cell, the light emitting devices of each sub-array being positioned in rows and columns to define a plurality of pixels of the image and operably connected to a plurality of connection/mounting pads adjacent outer edges of each sub-array;

at least one driver/control circuit having a plurality of connection/mounting pads, mounted to the at least one inactive area defined on the substrate, connected to the light emitting devices through a plurality of electrical conductors extending between the plurality of connection/mounting pads of the at least one driver/control circuit to the plurality of connection/mounting pads of the at least one sub-array;

a lens system positioned so as to receive and magnify light emitted by the at least one sub-array of light emitting devices; and a phase spatial light modulator scanner, positioned to allow for the light emitted by the at least one sub-array of light emitting devices to pass therethrough and be spatially modulated, thereby generating a resultant integrated image viewable by an observer as one of direct, virtual and projected image.

16. A visual image display system as claimed in claim 15 wherein the lens system includes at least one optical element.

17. A visual image display system as claimed in claim 16 wherein the at least one optical element is one of a diffractive lens and a refractive lens.

18. A visual image display system as claimed in claim 17 wherein the phase spatial light modulator scanner includes one of a liquid crystal scanner, a electro-optic scanner and an acousto-optic scanner.

19. A portable electronic device with visual display comprising:

a portable electronic device having a data output terminal;

a miniature visual image display having a viewing aperture, the miniature visual image display being operably attached to a receiver and including at least one sub-array of light emitting devices cooperating to generate an image, mounted on a substrate, thereby defining an active area and at least one inactive area of a unit cell, the light emitting devices of each sub-array being positioned in rows and columns to define a plurality of pixels of the image and operably connected to a plurality of connection/mounting pads adjacent outer edges of each sub-array;

at least one driver/control circuit having a plurality of connection/mounting pads, mounted to the at least one inactive area defined on the substrate, connected to the light emitting devices through a plurality of electrical conductors extending between the plurality of connection/mounting pads of the at least one driver/control circuit to the plurality of connection/mounting pads of the at least one sub-array;

a lens system positioned so as to receive and magnify light emitted by the at least one sub-array of light emitting devices; and a phase spatial light modulator scanner, positioned to allow for the light emitted by the at least one sub-array of light emitting devices to pass therethrough and be spatially modulated, thereby generating a resultant integrated image viewable by an observer as one of direct, virtual and projected image.

20. A portable electronic device with visual display as claimed in claim 19 wherein the lens system is comprised of at least one of a diffractive lens, and a refractive lens, designed to magnify the image generated by the at least one sub-array of light emitting devices.

21. A portable electronic device with visual display as claimed in claim 19 wherein the portable electronic device includes portable communications equipment.

22. A portable electronic device with visual display as claimed in claim 21 wherein the portable communications equipment is one of a cellular telephone, a two-way radio, a data bank, a smart-card reader and a pager.

* * * * *